United States Patent
Wunderer

(10) Patent No.: US 9,905,727 B2
(45) Date of Patent: Feb. 27, 2018

(54) FABRICATION OF THIN-FILM DEVICES USING SELECTIVE AREA EPITAXY

(71) Applicant: Palo Alto Research Center Incorporated, Palo Alto, CA (US)

(72) Inventor: Thomas Wunderer, Palo Alto, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 0 days.

(21) Appl. No.: 15/345,046

(22) Filed: Nov. 7, 2016

(65) Prior Publication Data
US 2017/0069788 A1 Mar. 9, 2017

Related U.S. Application Data

(62) Division of application No. 14/283,392, filed on May 21, 2014, now Pat. No. 9,490,119.

(51) Int. Cl.
| | |
|---|---|
| *H01L 21/02* | (2006.01) |
| *H01L 33/12* | (2010.01) |
| *H01L 29/20* | (2006.01) |
| *H01L 21/78* | (2006.01) |
| *H01L 33/00* | (2010.01) |
| *H01L 29/778* | (2006.01) |
| *H01L 29/861* | (2006.01) |

(Continued)

(52) U.S. Cl.
CPC .......... *H01L 33/12* (2013.01); *H01L 21/0254* (2013.01); *H01L 21/02458* (2013.01); *H01L 21/02532* (2013.01); *H01L 21/02639* (2013.01); *H01L 21/02647* (2013.01); *H01L 21/02664* (2013.01); *H01L 21/7813* (2013.01); *H01L 29/20* (2013.01); *H01L 29/2003* (2013.01); *H01L 29/7787* (2013.01); *H01L 29/8613* (2013.01); *H01L 33/007* (2013.01); *H01L 33/0079* (2013.01); *H01L 33/06* (2013.01); *H01L 33/32* (2013.01); *H01L 33/405* (2013.01);

(Continued)

(58) Field of Classification Search
CPC ......... H01L 21/02365; H01L 21/02518; H01L 21/02436; H01L 21/70; H01L 21/702; H01L 21/71
See application file for complete search history.

(56) References Cited

U.S. PATENT DOCUMENTS

| 5,217,564 A | 6/1993 | Bozler et al. |
|---|---|---|
| 7,638,810 B2 | 12/2009 | Bour et al. |

(Continued)

OTHER PUBLICATIONS

Kasahara et al., "Demonstration of Blue and Green GaN-Based Vertical-Cavity Surface-Emitting Lasers by Current Injection at Room Temperature", Applied Physics Express 4 (2011), 3 pages.

(Continued)

*Primary Examiner* — Cheung Lee
(74) *Attorney, Agent, or Firm* — Hollingsworth Davis, LLC

(57) ABSTRACT

A thin film device described herein includes a first thin film layer, a second film layer and a heterostructure within the second film layer. The first thin film layer is atop a substrate. The second thin film layer is grown from the first thin film layer through a patterned mask, having openings, under selective area growth (SAG) conditions. The second thin film layer is configured to be released from the first thin film layer by etching a trench. The etched trench may provide access to the patterned mask and the patterned mask may be eliminated with a wet etchant.

20 Claims, 13 Drawing Sheets

(51) Int. Cl.
- *H01L 33/06* (2010.01)
- *H01L 33/32* (2010.01)
- *H01L 33/40* (2010.01)
- *H01S 5/042* (2006.01)
- *H01S 5/183* (2006.01)
- *H01S 5/187* (2006.01)
- *H01S 5/343* (2006.01)

(52) U.S. Cl.
CPC ............. *H01S 5/0421* (2013.01); *H01S 5/183* (2013.01); *H01S 5/187* (2013.01); *H01S 5/34333* (2013.01)

(56) References Cited

U.S. PATENT DOCUMENTS

| | | |
|---|---|---|
| 8,053,811 B2 | 11/2011 | Hiramatsu et al. |
| 8,119,534 B2 | 2/2012 | Tanaka et al. |
| 8,344,403 B2 | 1/2013 | Niki et al. |
| 2004/0082150 A1 | 4/2004 | Kong et al. |
| 2006/0284163 A1 | 12/2006 | Bour et al. |
| 2012/0161113 A1 | 6/2012 | Lowenthal et al. |
| 2012/0161196 A1 | 6/2012 | Lowenthal et al. |
| 2012/0161338 A1 | 6/2012 | Lowenthal et al. |
| 2012/0164797 A1 | 6/2012 | Lowenthal et al. |

OTHER PUBLICATIONS

Kizilyalli et al., "High Voltage Vertical GaN o-n Diodes with Avalanche Capability", IEEE Transactions on Electron Devices, vol. 60, No. 10, Oct. 2013, pp. 3067-3070.

Wunderer et al., "Semipolar GaInN/GaN Light-Emitting Diodes Grown on Honeycomb Patterned Substrates", Physica Status Solidi, Dec. 7, 2009, 4 pages.

Wunderer, "Three-dimensional light emitting InGaN/GaN structures with reduced piezoelectric field", May 2010, 186 pages.

Wunderer et al., "Three-dimensional GaN for semipolar light emitters", Physica Status Solidi, 2010, 12 pages.

FABRICATION OF THIN-FILM DEVICES USING SELECTIVE AREA EPITAXY

RELATED APPLICATIONS

This application is a divisional of U.S. Ser. No. 14/283,392, filed May 21, 2014, which is incorporated herein by reference in its entirety.

TECHNICAL FIELD

The present disclosure relates to thin-film fabrication and, more particularly, to thin-film fabrication using selective area epitaxy.

BACKGROUND

Gallium nitride-based devices (e.g., light emitting diodes (LEDs), transistors, etc.) are typically fabricated on foreign substrates such as sapphire, Si, etc. due to the relatively moderate costs for large-sized wafers. However, the large mismatch of the lattice constants and thermal expansion coefficients between foreign substrates and epitaxial layers lead to generation of a large number of extended defects and consequently inferior device performance. In recent years, significant progress has been made in the fabrication of GaN substrates. The higher priced substrates are typically used for devices that are operated under high power densities (e.g., laser diodes or high power LEDs). While these substrates offer a number of advantages (lower defect densities, shorter growth time, simpler processing steps) it seems unlikely that substrate costs for high-quality, large-area GaN wafers will drop sufficiently for large-scale manufacturing in the foreseeable future.

SUMMARY

The present disclosure describes devices and methods related to thin-films created by using selective area epitaxy and a substrate removal process. An example embodiment of a device described herein includes a first thin film layer, a second film layer and a heterostructure within the second film layer. The first thin film layer is atop a substrate. The second thin film layer is grown from the first thin film layer through a patterned mask, having openings, under selective area growth (SAG) conditions. The second thin film layer is configured to be released from the first thin film layer by etching a trench. The trench may provide access to the patterned mask and the patterned mask may be eliminated with a wet etchant.

Further, the second thin film layer may comprise a gallium-nitride based film. The second thin film layer may have a height substantially in the range of 2 μm to 20 μm. The second thin film layer may have an area substantially in the range of 25 μm$^2$ to 1 mm$^2$. The second thin film layer may be configured to be incorporated into a printed electronic device, a flexible transparent display, a flexible large area luminaire display, a photovoltaic display, a micro-display, an integrated circuit or a light-emitting diode chiplet. The integrated circuit may comprise a light-emitting diode, a laser diode, a vertical-cavity surface-emitting laser, a transistor or a diode.

Another example embodiment of a device disclosed herein comprises an epitaxial film having a first film portion and a second film portion. The second film portion is configured to substantially planarize the first film portion, wherein upon the planarization of the first film portion a detectable artifact is created intermediate the second film portion and the first film portion. The epitaxial film may comprise a gallium-nitride based film. The artifact may comprise an air pocket. The epitaxial film may be grown on a substrate and released from the substrate through use of a wet etchant at a perforated interface. The epitaxial film may include side-bent threading dislocations positioned below a heterostructure region of the epitaxial film. The epitaxial film may be configured to be incorporated into a printed electronic device, a flexible transparent display, a flexible large area luminaire display, a photovoltaic display, a micro-display, an integrated circuit or a light-emitting diode chiplet. The integrated circuit may comprise a light-emitting diode, a laser diode, a vertical-cavity surface-emitting laser, a transistor or a diode.

An example embodiment of a method for fabricating a thin-film device as disclosed herein includes: growing a first film on a substrate, depositing and patterning a mask atop the first film, growing a second film about the mask, growing a device heterostructure within the second film, establishing a perforated interface within the second film, and releasing the second film from the first film. The perforated interface may provide access to the mask, and the method may further comprise applying a wet etchant to the perforated interface to release the second film from the underlying first film. The second film may comprise a gallium-nitride based epitaxial film. The heterostructure may comprise a heterostructure for a light-emitting diode, a laser diode, a vertical-cavity surface-emitting laser, a transistor or a diode. The method may additionally include growing the second film by growing a three-dimensional film portion and a two-dimensional film portion to substantially planarize the three-dimensional portion. And, the method may additionally include creating a trench extending from a top surface of the second film through the mask.

The above summary is not intended to describe each embodiment or every implementation. A more complete understanding will become apparent and appreciated by referring to the following detailed description and claims in conjunction with the accompanying drawings.

BRIEF DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
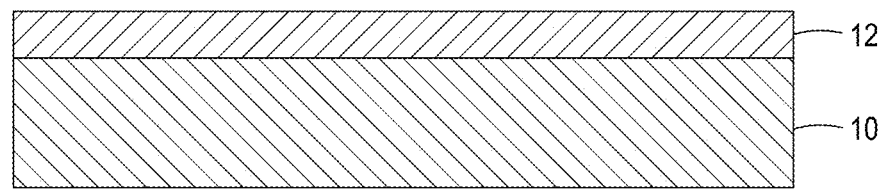
FIG. 1 illustrates an initial procedure in the fabrication of a thin-film device according to an example embodiment.

Due at least in part to high substrate costs, high-demand devices such as gallium nitride (GaN)-based light-emitting diodes (LEDs), high-electron-mobility transistors (HEMTs), etc., are typically fabricated on inexpensive substrates like $Al_2O_3$, Si, SiC, etc. Due to the high mismatch in lattice constants and thermal expansion coefficients between the substrate and the epitaxial films, numerous vertical dislocations/defects can result within the epitaxial film which negatively affect the performance and lifetime of the devices. As such, complicated heterostructures have to be developed, appropriate to the inexpensive substrates, to achieve acceptable defect densities in the range of $10^8$-$10^9$ $cm^2$. The use of these types of inexpensive substrates may result in higher overall costs and additional manufacturing time for longer epitaxial growth runs, complicated substrate removal techniques (e.g., laser lift-off and back-side etching of the entire substrate), and limited device operation conditions as well as reduced lifetime and reliability. These factors may also limit the achievable yield of devices during thin-film fabrication.

State-of-the-art GaN-based LEDs already show peak internal quantum efficiency (IQE) values exceeding 90% within the blue spectral range. However, the high efficiencies are typically achieved at low carrier injection levels and are significantly lower at actual LED operation. A reduction in performance is also seen for longer emission wavelengths, i.e., for green emitters where higher indium contents in the (quantum wells) QWs are needed. The loss of efficiency with higher drive current, also known as "droop," is one of the issues in today's LED industry. Consensus is converging on Auger-like recombination as the ultimate reason for droop, an intrinsic material properties phenomenon.

Droop can be reduced by reducing the carrier density within the light emitting area. This can be realized by increasing chip size (with higher costs per chip) or by spreading the carriers into more and/or thicker QWs. However, the latter is not trivial to achieve. First, a thicker active zone is difficult to implement without degradation of material quality. Second, thicker quantum wells lead to a larger influence of the quantum confined Stark effect and a reduced overlap of electron-hole wave functions, with a reduced radiative recombination probability. Third, the limited mobility of holes in combination with high potential barriers at the heterostructure interfaces can lead to a situation where only the top-most QWs are effectively pumped. Non- and semipolar crystal orientations may reduce internal electric fields and mitigate the above issues. However, besides the fact that impurity incorporation may be much higher for these crystal orientations and that contact resistances can be inferior compared to c-plane material, another challenge is the high price and the limited availability of large-size non- or semipolar substrates.

The present disclosure is directed to the utilization of SAG in combination with straightforward thin film release techniques that can be used to create devices of various sizes. For example, the concepts may be used to create conventional-sized devices on the order of 1×1 $mm^2$ or device chiplets on the order of 10×10 $\mu m^2$. The concepts illustrated herein are further directed to the utilization of high quality GaN-based material on inexpensive substrates in combination with straightforward fabrication. Additionally, the present disclosure is directed to a low defect density, strain-optimized GaN-based on large-area substrates (e.g., sapphire, Si) by advancing selective area growth (SAG) that enables production of high-power LEDS with improved performance and lower manufacturing cost. It should be noted that while the present disclosure utilizes GaN in its detailed description other suitable materials, for example GaInN, may be used as appropriate to a specific application.

SAG is understood to generally involve the local growth of an epitaxial layer through a patterned growth mask deposited on a semiconductor substrate. Using facet-assisted epitaxial lateral overgrowth (FACELO), a SAG technique, vertically running threading dislocations (TDs) may be bent sideward and embedded within the heterostructure to realize a nearly defect-free layer where the active zone of an LED can be positioned. An intelligent mask design (e.g., a honeycomb pattern) may achieve low defect densities with good wafer homogeneity and little to no wing-tilt. Expanding upon FACELO, the present disclosure illustrates how to reduce strain within the active zone of GaN-based LEDs by growing the device heterostructures on a high-quality $Ga_{1-x}In_xN$ buffer. In some implementations, the target is x>0.08. The growth mask of the present disclosure allows the laterally expanding films to grow detached from the substrate, such that strain-induced material quality degradation (e.g., creation of V-defects) is reduced or substantially absent. A strained or strain-optimized active zone may lead to increased performance for both high power operation ("droop") and for longer wavelength emitters ("green gap"). Another feature of the present disclosure is the ability to remove the epitaxial film from the substrate without the need for complicated substrate removal techniques such as laser lift-off or chemical removal of the entire wafer. Furthermore, the controlled substrate separation of the present disclosure allows for the option of re-using the initial substrate or template with minor additional preparation.

In the present disclosure, high-quality InGaN buffer layers with TD densities (TDD) less than $10^7$ $cm^2$ are illustrated. The difference in indium composition between the buffer and the quantum wells (QWs) is substantially within 5-10%. This enables increasing the QW thickness to approximately 10 nm for multiple QWs to push the onset droop by about an order of magnitude. The absolute performance of longer wavelength emitters (e.g., green QWs with 25% In composition) substantially approaches the levels of their shorter wavelength counterparts (e.g., blue QWs with 15% In). Further, the present disclosure illustrates an approach to take advantage of the controllable growth in c-direction and to strain-engineer the substrate in such a way that the internal strain-induced electric fields are reduced as with non- or semipolar crystal orientations. With a template or quasi-substrate providing a lattice constant that is much closer to that of the active zone, the use of thicker QWs provides a good overlap of electron-hole wave functions and lower potential barriers at the heterostructure interfaces. This leads to reduced carrier density and improved hole transport to homogeneously populate a large number of QWs. As a result, droop behavior is improved at high drive currents. In addition, the smaller difference in lattice constants between the QWs and the InGaN buffer improve the overall material quality of the active zone, in particular for the higher-indium-containing layers needed for green or even longer wavelength emitting devices.

Moreover, the present disclosure describes example embodiments of gallium nitride (GaN) based thin-film devices and methods for fabricating GaN-based thin-film devices using a combination of selective area epitaxy, dry etching, and wet etching. The types of thin-film devices for which the present disclosures embodiments are appropriate include, but are not limited to, LEDs, LDs, VCSELs, transistors and diodes. With the approaches described herein, high material quality, high device performance, and simplified fabrication of devices resulting in reduced costs can be substantially achieved. In utilizing selective area epitaxy, or selective area growth (SAG), as described herein, a reduction of structural defects within the resulting thin-film material may be realized on inexpensive and large-sized substrates such as silicon and the like. Furthermore, the SAG techniques described herein provide the ability to redirect the propagation of threading dislocations (TDs) away from the active zone of the epitaxial film which provides higher performance devices with increased lifetimes.

In an example embodiment described herein, a SAG mask in the configuration of a honeycomb pattern is used. The patterned mask enables the separation of the epitaxial film from the underlying substrate without the need for a complicated substrate removal process such as laser lift-off for sapphire substrates or back-side removal for silicon substrates. Rather, the separation of the epitaxial film from the substrate is achieved through a combination of dry and wet etching. The use of dry and wet etching substantially ensures that the substrate is not destroyed after the removal process and that the substrate may be reused after some minor preparation. However, it should be noted that dry etching itself may be sufficient for separation. Further, under the appropriate conditions, even dry etching may be avoided by applying an external force to initiate separation of the epitaxial film from the substrate along the perforated interface.

An example embodiment of a fabrication process for GaN-based thin-film devices is described herein below. The process begins with a substrate 10 upon which a GaN film 12 is grown, see FIG. 1. The substrate 10 may comprise any suitable substrate including inexpensive substrates of sapphire, silicon, silicon carbide, etc. A substrate of GaN, a more expensive material, may also be used in which case the need to grow an initial GaN film is eliminated as GaN is already present. Next, a SAG mask 14 is deposited atop the initial GaN film 12, see FIGS. 2A-2B. Other appropriate means may be also used for establishing the SAG mask. For example, the SAG mask may be directly deposited on the substrate or on a thin nucleation layer on the substrate that may comprise GaN, AlN, GaInN, AlGaN, or AlGaInN, etc. The SAG mask 14 itself may be of various suitable materials that are stable in a GaN growth environment (e.g., high T, H2 atmosphere, etc.) and provide sufficient selectivity, i.e., no growth should occur on the mask. Examples of appropriate mask materials include, but are not limited to $SiO_2$, $SiO_x$, SiN, TiN, $Al_2O_3$, HfN, etc.

Figure 2A:
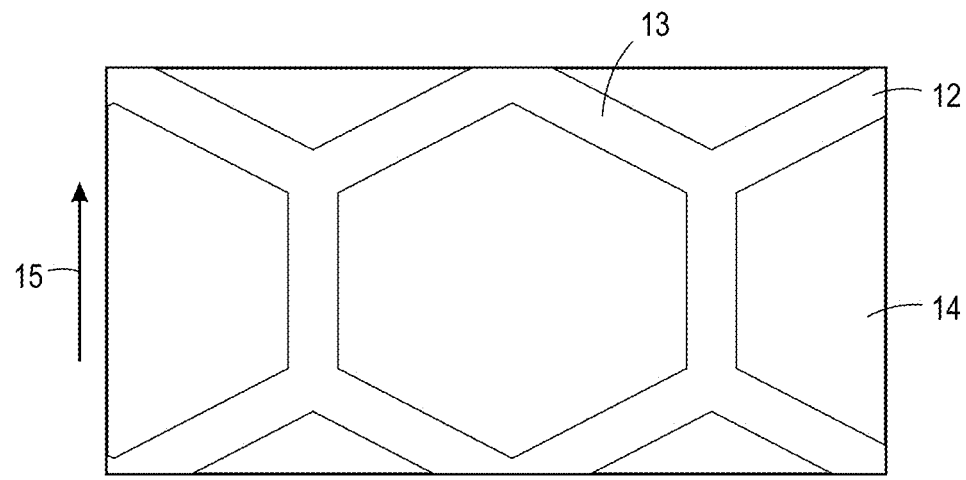
FIGS. 2A-2B illustrate a mask pattern used in the fabrication of a thin-film device according to an example embodiment.
Figure 2B:
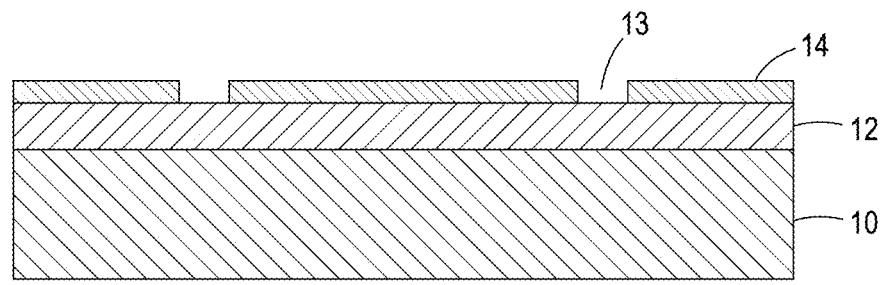
Figure 3:
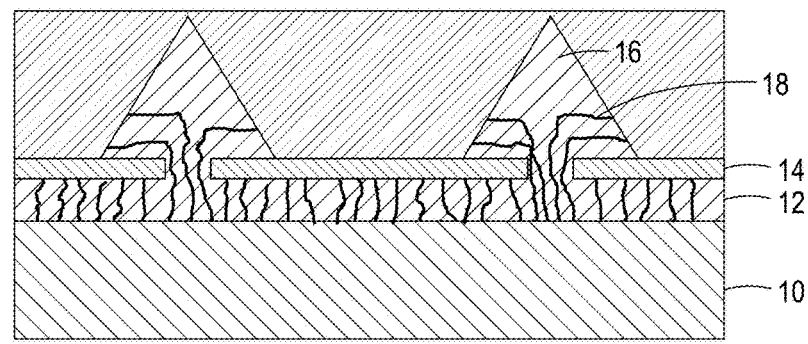
FIG. 3 illustrates a procedure used in the fabrication of a thin-film device according to an example embodiment.

In the example embodiment of FIGS. 2A-2B, the mask 14 is in a honeycomb, i.e., separated hexagonal, pattern, wherein each hexagon of the honeycomb has a width in the range of approximately 5 μm to approximately 50 μm. The mask pattern may be of any suitable configuration, however, one that provides an encircling/enclosing growth pattern 13 is preferred. The mask 14 material may be any suitable masking material such as silicon dioxide, silicon nitride, titanium nitride, etc. Note that the GaN m-direction is noted on FIG. 2A with arrow 15. FIG. 3 is a scanning electron microscope (SEM) image illustrating GaN grown out of mask openings.

Figure 4:
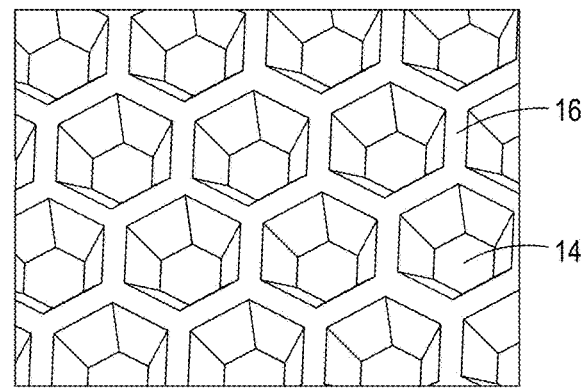
FIG. 4 is a scanning electron microscope (SEM) image illustrating three-dimensional gallium nitride (GaN) grown out of mask openings.
Figure 5:
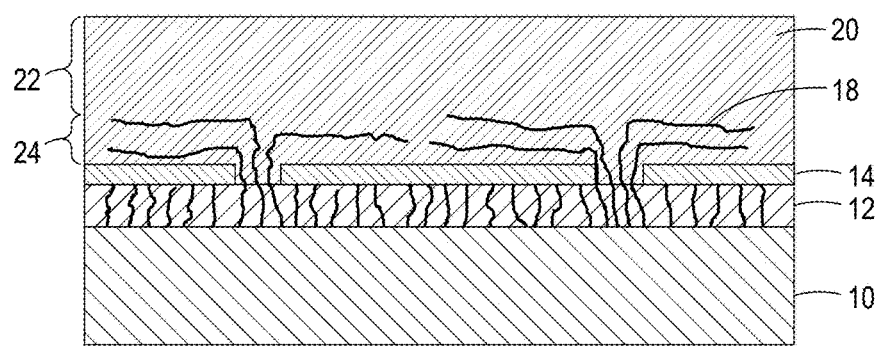
FIG. 5 illustrates a procedure used in the fabrication of a thin-film device according to an example embodiment.

After deposition of the patterned mask 14, SAG is used to encourage GaN growth. Specifically, three-dimensional growth of GaN is produced by utilizing appropriate SAG growth parameters. Such growth parameters typically include low temperature, high pressure and a high V/III ratio (molar ratio of group V (N) to group III (Ga) species). The result of the three-dimensional growth mode, i.e., ridges 16, is shown in FIG. 3 and further illustrated in the scanning electron microscope (SEM) image of FIG. 4 where three-dimensional GaN has grown out of mask 14 openings. Notably in FIG. 3, the threading dislocations (TDs) 18 above the mask 14 have bent sideways. Subsequently, the epitaxial film 20 of GaN is planarized by utilizing SAG growth parameters that encourage two-dimensional growth, see FIG. 5. Two-dimensional growth parameters typically include high temperature, low pressure and a low V/III ratio. The resulting epitaxial film 20 includes an upper portion 22 substantially free of TDs, i.e., a high-quality GaN film is present, and a lower portion 24 having few TDs presenting in a planar/horizontal position.

The description immediately above describes the splitting of selective area growth into two sections with different growth conditions—one utilizing three-dimensional growth and one utilizing two-dimensional growth. This is done because bending of TDs and reduction of wing tilt can be achieved. However, it should be noted that alternate growth conditions can be used to achieve similar results. For example, one could apply a single set of growth conditions, e.g., two-dimensional growth conditions. This type of growth is called ELOG or ELO (epitaxial lateral overgrowth) compared to the FACELO used in the paragraph above.

Figure 6:
FIG. 6 is an optical microscopy image illustrating a planarized epitaxial film according to an example embodiment.

FIG. 6 provides an optical microscopy image illustrating an example of a closed, planarized GaN epitaxial film 20 incorporating 20 μm hexagons. A growth time of four hours closed the epitaxial film 20; the growth time is appropriate for 20 μm to 30 μm hexagons. The potential for 50 μm to 100 μm hexagons is also possible. Notable within the epitaxial film of FIG. 6 is the existence of a centrally located artifact 21. The artifact 21 occurs as the three-dimensional structures within the epitaxial film 20 are grown then covered by two-dimensional growth. The artifact 21 is a small hole, or air pocket, that exists between the very top or tip of the triangularly-shaped three-dimensional structure and the overlying planar two-dimensional growth; this artifact appears as a dark spot in an optical microscope image and is specific to the embodiments described herein.

Figure 7:
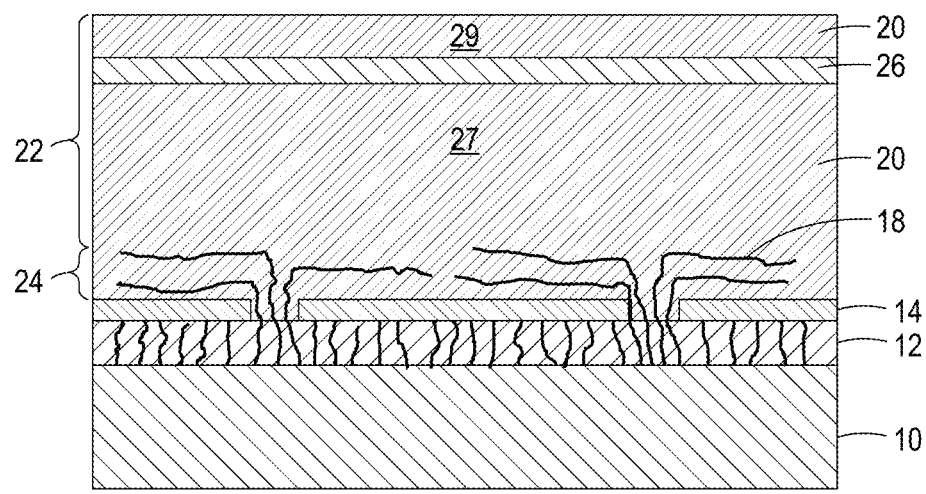
FIG. 7 illustrates a procedure used in the fabrication of a thin-film device according to an example embodiment.

After the epitaxial film 20 has been planarized, a device heterostructure, e.g., light emitting diode heterostructure or desired heterostructure, is grown including the active zone 26 of the epitaxial film 20 whereby an n-GaN layer 27 and p-GaN layer 29 is formed, see FIG. 7. In an example embodiment, the active zone 26 may comprise an InGaN-based multi-quantum well (MQW) structure.

Figure 8:
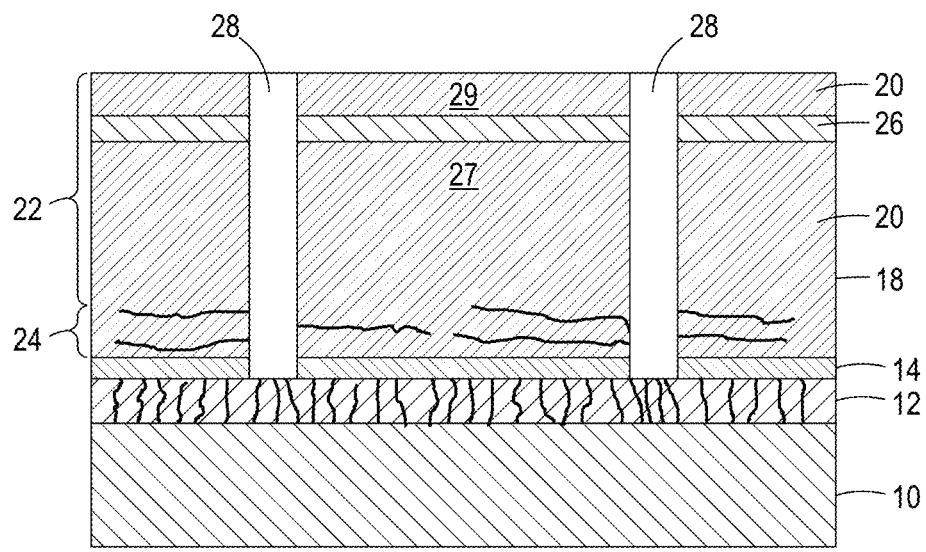
FIG. 8 illustrates a procedure used in the fabrication of a thin-film device according to an example embodiment.
Figure 9:
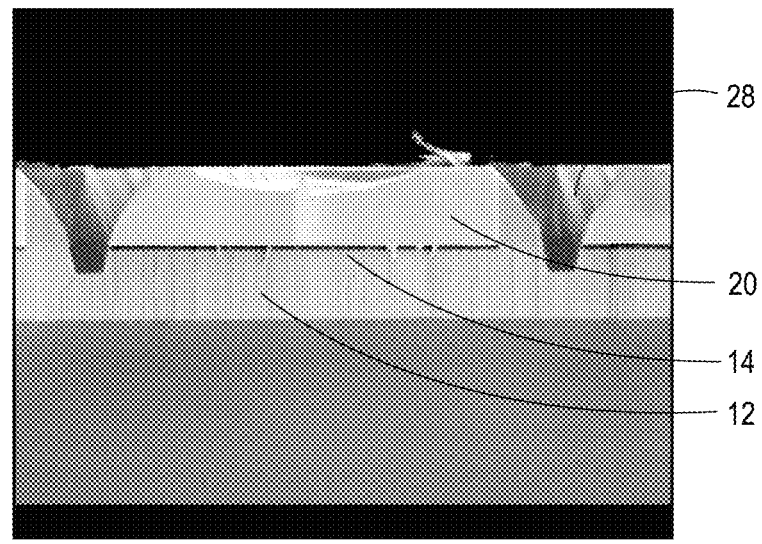
FIG. 9 is a SEM image illustrating the results of a dry etch according to an example embodiment.

With the heterostructure in place, and after completion of any other desired processing sequences, e.g., metallization, contact formation, mirror coatings, etc., the separation of the epitaxial film 20 from the substrate 10 can be achieved by a combination of dry and wet etching. In an example embodiment, anisotropic dry etching, such as reactive ion etching, chemically assisted ion beam etching, etc., is used to create trenches 28 through the epitaxial film 20, see FIG. 8. The trenches 28 are at least as deep as the epitaxial film 20 and may extend even further keeping in mind the intended goal of enabling access to the mask 14 and to weaken or eliminating the connection between first and second thin film layer. The anisotropic dry etch step is performed in a pattern substantially identical to and substantially in alignment with the underlying mask 14. FIG. 9 is a SEM image illustrating the results of a dry-etch experiment wherein the trenches 28 extend past the epitaxial film 20, the remaining underlying mask 14 and into the original GaN film 12.

Figure 10:
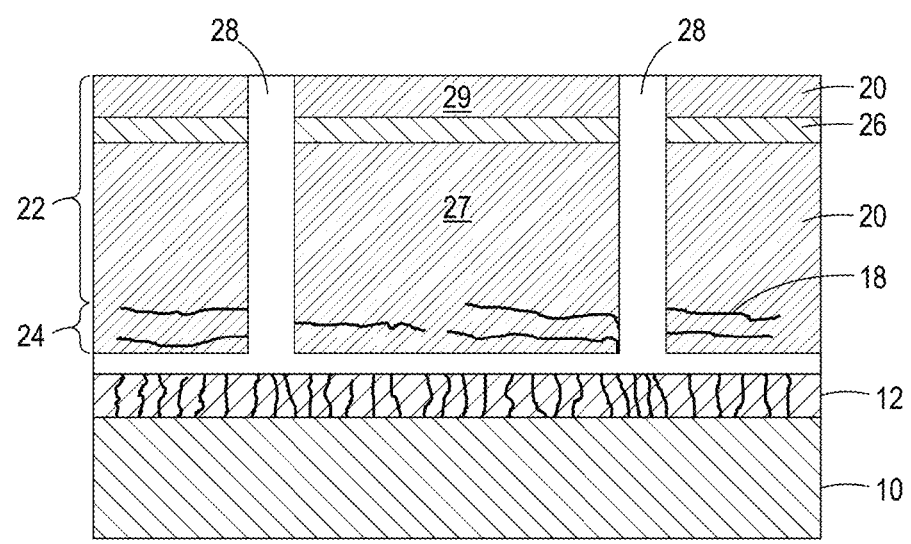
FIG. 10 illustrates a procedure used in the fabrication of a thin-film device according to an example embodiment.
Figure 11:
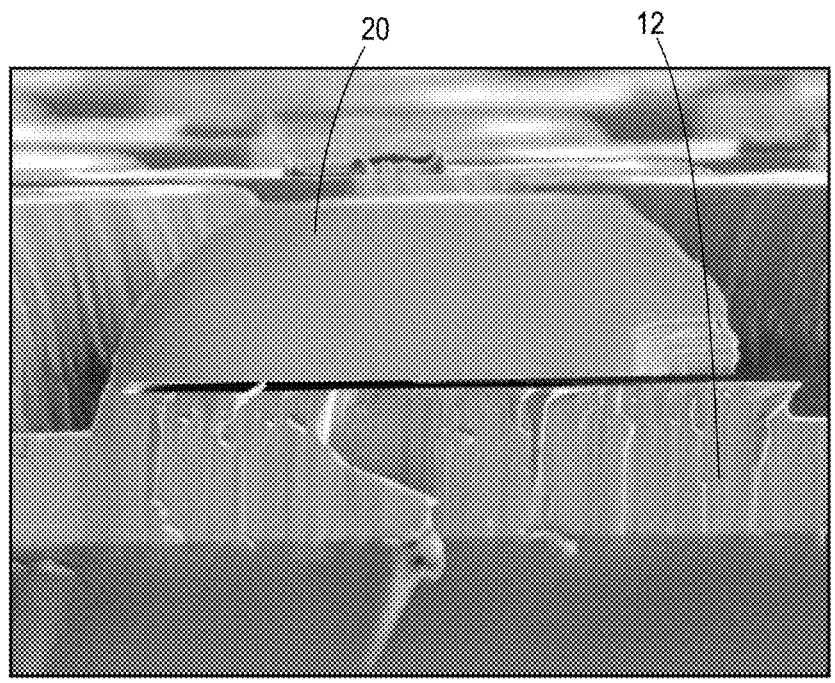
FIG. 11 is a SEM image illustrating the result of a wet etch according to an example embodiment.
Figure 12:
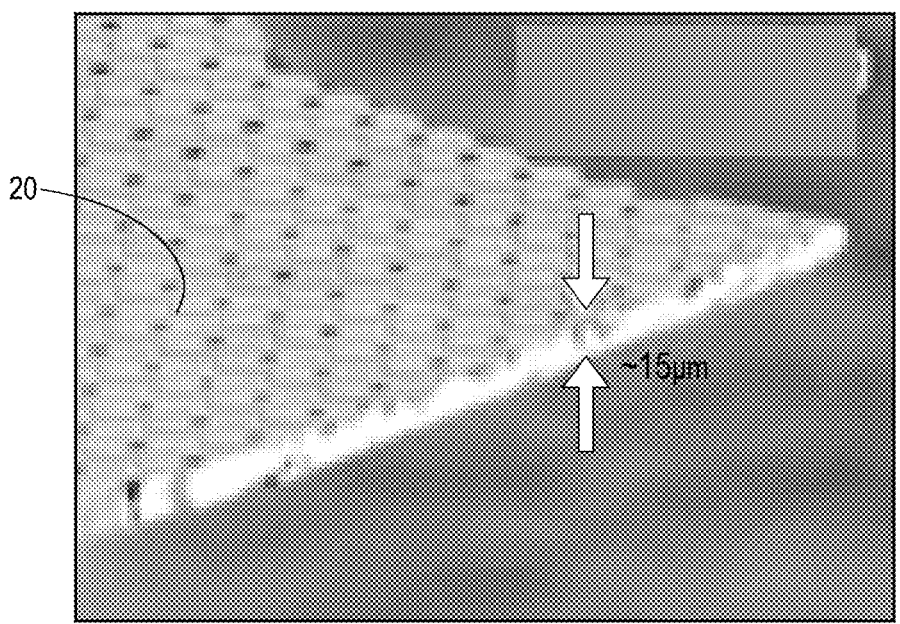
FIG. 12 is a SEM image illustrating an epitaxial thin film according to an example embodiment.

After creation of the trenches 28, which establishes a perforated interface to the mask 14, the mask 14 is removed by applying an appropriate wet etchant, e.g., hydrofluoric acid for a silicon dioxide mask, see FIG. 10. Now, the entire epitaxial film 20 can be lifted off. Depending on the specific mask design, individual GaN-based chiplets (5 μm to 100 μm in diameter, and height of 2 to 20 μm), or if the film 20 is still laterally connected, larger sized thin-films can be fabricated (for an example of a homogenous large-size grown epitaxial film see FIG. 12, described further below). Notably, the substrate 10 is not destroyed through this process and can, thus, be reused after some minor preparation. This feature may reduce costs for various substrates particularly if a high-quality substrate such as GaN is used. FIG. 11 is a SEM image illustrating the results of a wet-etch procedure subsequent a dry-etch procedure. As shown, the remaining underlying mask 14 is no longer present and the epitaxial film 20 is free from the original GaN film 12. FIG. 12 is a SEM image of a free-standing epitaxial film 20 that has been released, via a wet-etch procedure, from an original GaN film. The depicted epitaxial film 20 has a height of approximately 15 μm (within the range of 5 μm to 20 μm) and has an area of larger than 1 mm by 1 mm. Once released from the substrate the chiplets, or the larger films as appropriate, may be printed with ink or otherwise conditioned for incorporation into an electronic or optoelectronic device.

Figure 13:
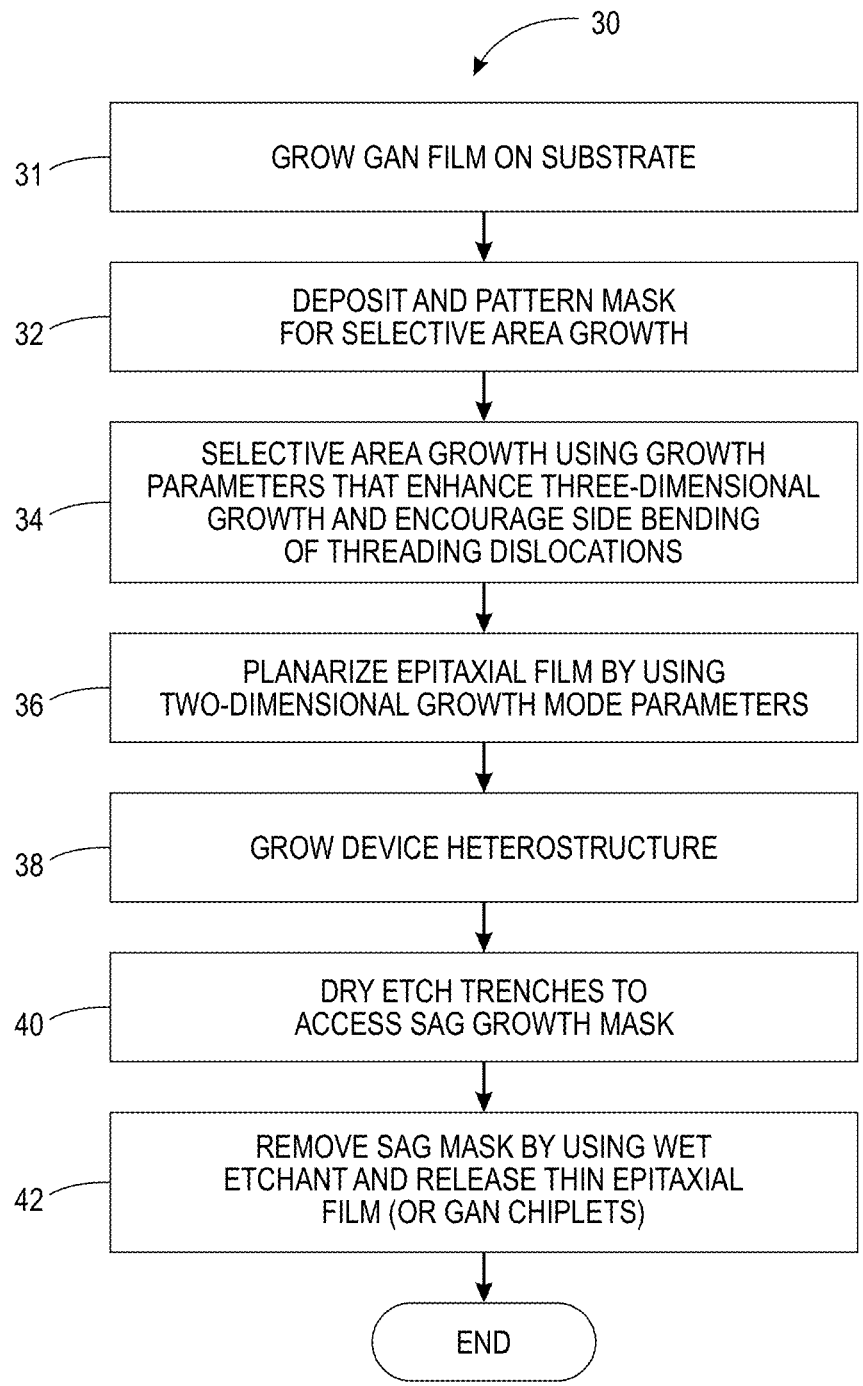
FIG. 13 is a flow chart identifying the procedures used in the fabrication of a thin-film device according to an example embodiment.

FIG. 13 is a flow chart condensing the procedures described above into a single illustration. As such, the thin-film fabrication procedure 30 includes growing an initial thin-film of GaN on a substrate, per block 31, depositing and patterning a mask atop the initial thin-film, per block 32, using SAG to create three-dimensional growth of the initial thin-film, per block 34, using SAG to create two-dimensional growth and planarize the three-dimensional growth into an epitaxial GaN thin-film, per block 36, growing a device heterostructure in the epitaxial film layer, per block 38, dry etching trenches to reach the mask and establish a perforated interface, per block 40, and wet etching to remove the mask and release the epitaxial film from the substrate, per block 42. Additional procedures may be added as necessary to fabricate a specific type of device.

It should be noted that while the above description includes reference to a wet etching step, this step may be eliminated as appropriate. For example, the physical connection between the original film 12 and film 20 is mainly provided by semiconductor material, e.g., GaN, within the mask 14 opening. There is no significant bonding between the film 20 and the mask material. This means that for an exemplary mask design with a 2 μm wide opening and a mask width of 8 μm only about 20% of the interface material supports adhesion of the film 20. As such, it may occur that after etching trenches, which substantially overlap the original mask openings, the remaining film 20 may already be lifted off even without eliminating the mask material with a wet etchant.

The chiplets and/or films created with the above-described procedure can be transferred to a substrate, e.g., a flexible substrate, and/or can be used in numerous applications including but not limited to printed electronics, flexible transparent displays, flexible large area luminaire or photovoltaic displays, integrated circuits (light emitting diodes, laser diodes, vertical-cavity surface-emitting lasers, transistors, diodes, etc.), high power light emitting diodes, GaN electronics, micro-displays (e.g., integrating a chiplet or multiple chiplets into a contact lens), etc.

FIGS. 14-19 depict additional processing procedures that may be performed to fabricate light emitting diode (LED) chiplets, including the incorporation of electrical contacts and optical reflectors. The figures illustrate a top most position for the electrical contact but it should be noted that the electrical contact and the epitaxial film may configured to present the contact at any location about the epitaxial film. Further, it should be noted that other standard and/or well-known procedures, such as those for creating inclined side reflectors and/or backside surface roughening, have not been shown for simplicity sake. The first procedures in fabricating the LED chiplet are the same as described earlier in reference to FIGS. 1, 2A-2B, 3, 5, 7, 8 and 10, and include growing initial GaN film 12 atop substrate 10, depositing and patterning mask 14 atop the initial film 12, using SAG to create three-dimensional ridge 16 growth and to bend threading dislocations 18 sideward, using SAG to create two-dimensional growth to planarize the three-dimensional growth and to produce epitaxial layer 20, and growing a device heterostructure within the active zone 26 of the epitaxial layer 20 whereby n-GaN layer 27 and p-GaN layer 29 are created.

Figure 14:
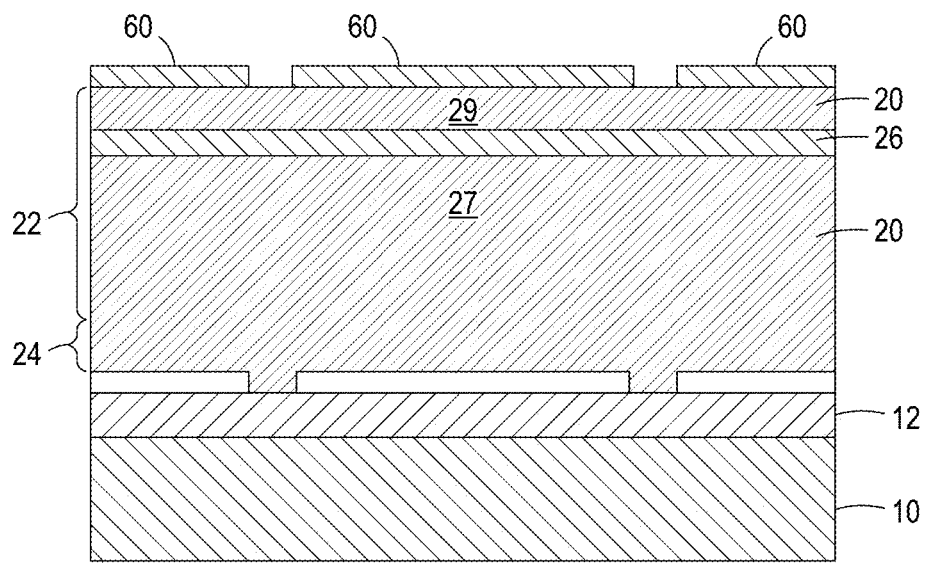
FIGS. 14-19 illustrate additional procedures used in the fabrication of a thin-film light emitting diode (LED) chiplet.
Figure 15:
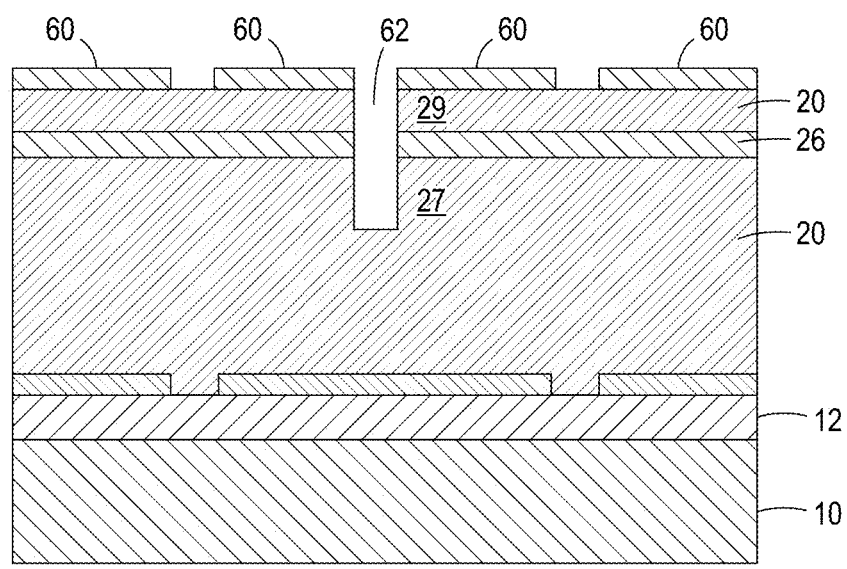
Figure 16:
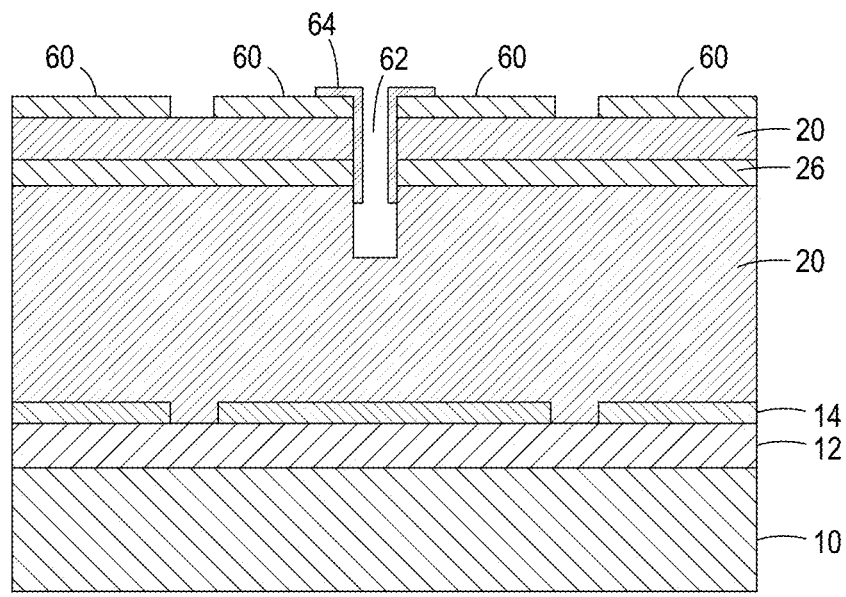
Figure 17:
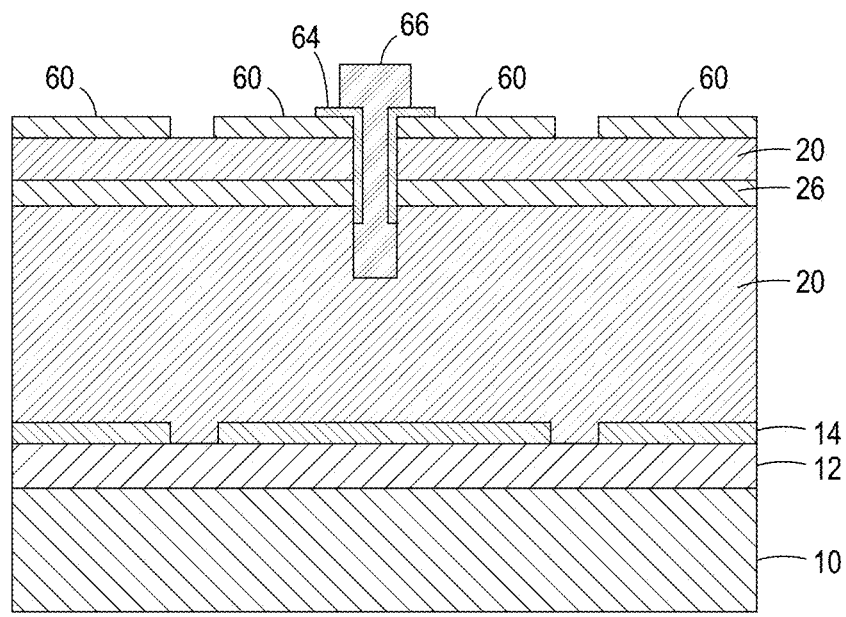
Figure 18:
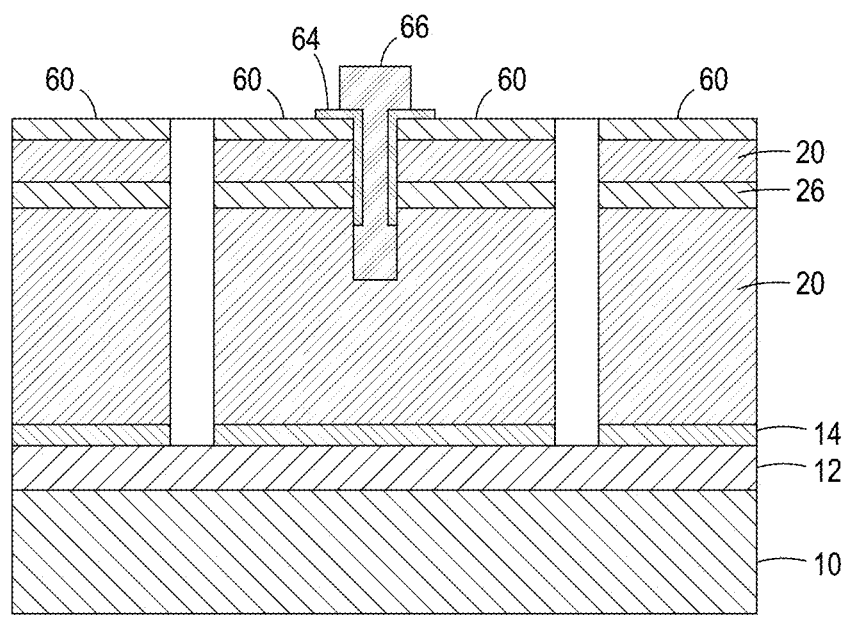
Figure 19:
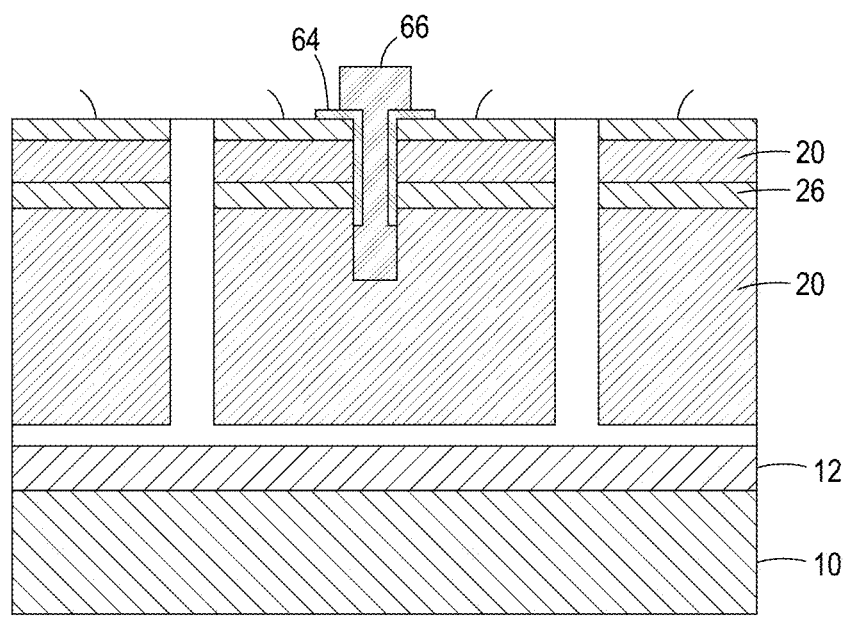

Next, per FIG. 14, a highly reflective, low contact resistance p-contact 60, e.g., silver-based contact, is deposited atop epitaxial layer 20 and patterned. Vias 62 are then etched to provide access to the n-GaN layer 27, see FIG. 15. An electrically isolating layer 64 is then deposited on part of the via 62 side facets, see FIG. 16. An n-metal contact layer 66, e.g., titanium/aluminum or titanium/gold or a combination of both, is then deposited within via 62 and annealed, see FIG. 17. The dry and wet etching procedures may now be completed to remove the LED chiplet 68 (FIG. 19) from the substrate. Dry etching creates the trenches 28 and provides a perforated interface access to the mask 14, see FIG. 18, and subsequent wet etching removes the remaining mask 14 and releases the LED chiplets 68, see FIG. 19.

Figure 20:
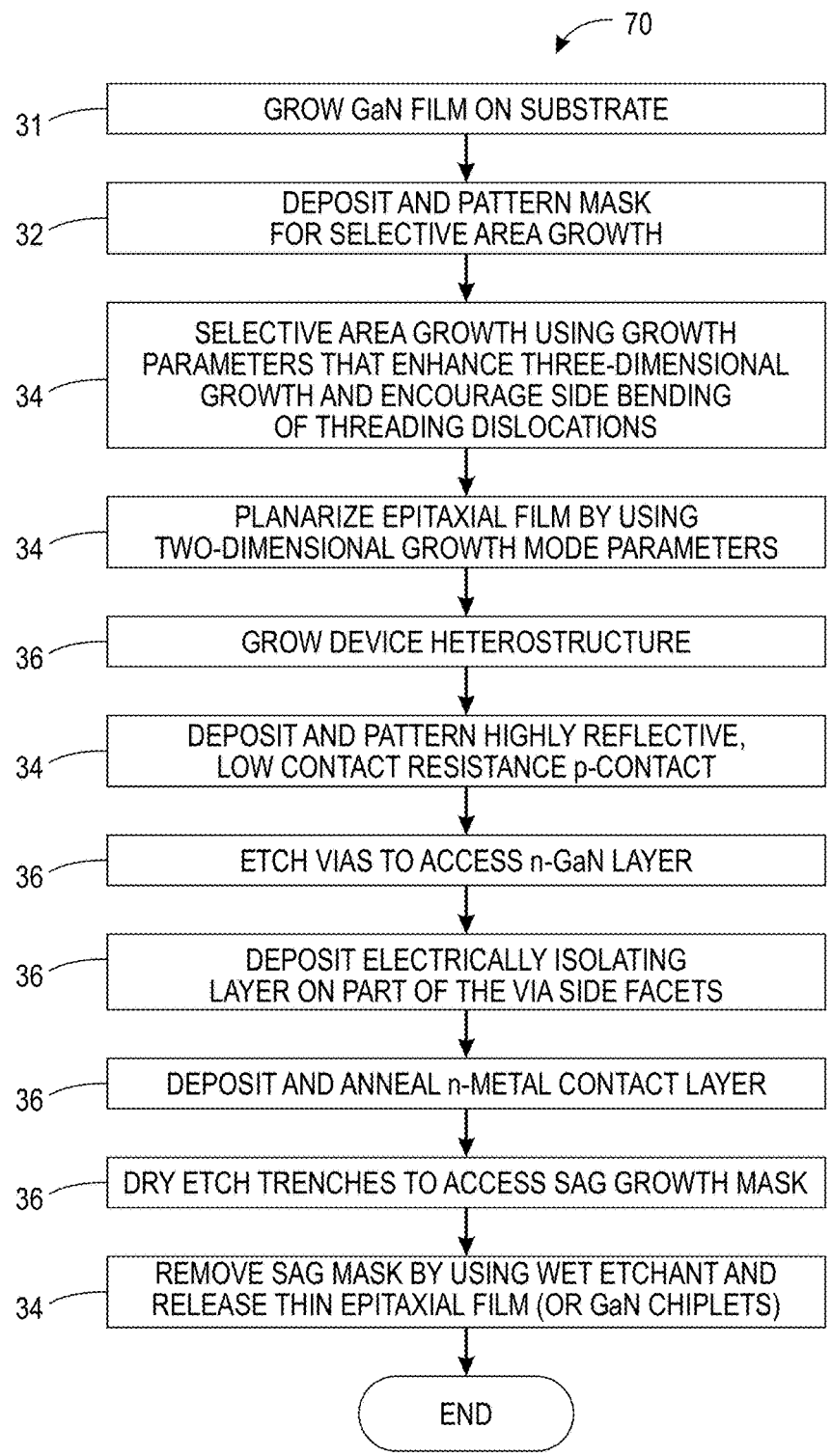
FIG. 20 is a flow chart identifying the procedures used in the fabrication of a thin-film LED chiplet.

FIG. 20 is a flow chart condensing the procedures described above into a single illustration. As such, the thin-film fabrication procedure 70 for an LED chiplet includes growing an initial thin-film of GaN on a substrate, per block 72, depositing and patterning a mask atop the initial thin-film, per block 74, using SAG to create three-dimensional growth of the initial thin-film, per block 76, using SAG to create two-dimensional growth and planarize the three-dimensional growth into an epitaxial GaN film, per block 78, growing a device heterostructure in the epitaxial layer, per block 80, depositing and patterning the p-contact/reflector atop the epitaxial layer, per block 82, etching vias to gain access to the n-GaN layer, per block 84, depositing an isolating layer on part of the via side facets, per block 86, depositing and annealing an n-metal contact layer, per block 88, dry etching trenches to reach the mask, per block 90, and wet etching to remove the remaining mask and release the epitaxial film from the substrate, per block 92. Additional procedures may be added in accordance with a specific design.

Figure 21:
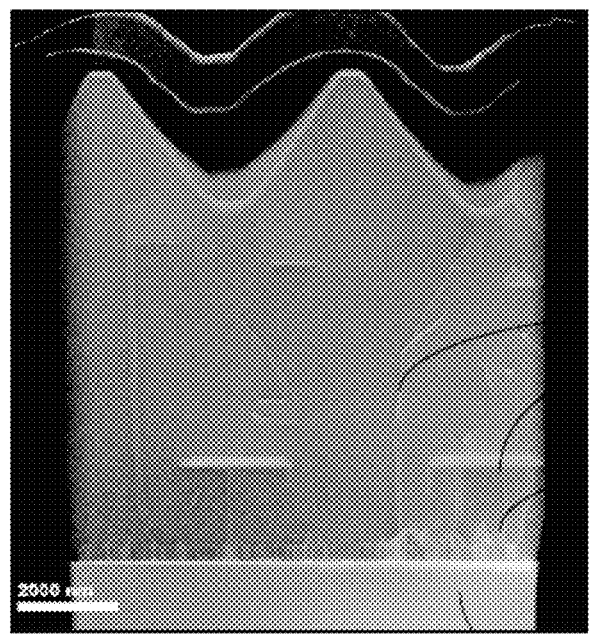
FIG. 21 is a transmission electron microscopy (TEM) image of a sample thin-film device taken during fabrication.
Figure 22:
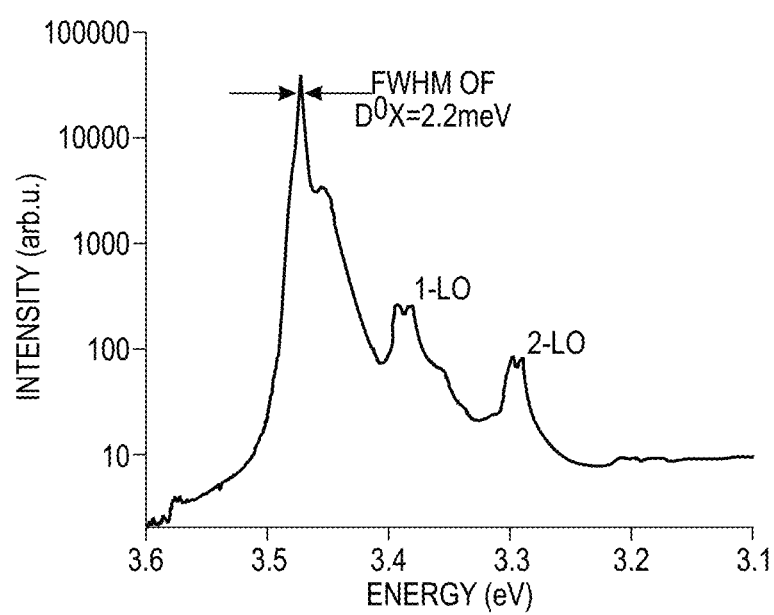
FIG. 22 is a photoluminescence (PL) spectrum of the sample of FIG. 21.

FIGS. 21 and 22 depict a TEM (transmission electron microscopy) image and photoluminescence (PL) spectrum, respectively, from a SAG sample. The SAG sample used was investigated after the three-dimensional growth mode, i.e., ridges 16 are present, but prior to the two-dimensional planarization described above. The TEM image shows the effective blocking and bending of TDs 18 while the small FWHM (full-width at half-maximum) of the D°X (neutral-donor-bound-excitron transitions) of 2.2 meV (million electron volts) in the low temperature PL spectrum confirms the high material quality of the GaN film. These results substantially confirm that a substantially uniform and desired high material quality can be achieved with the above-described fabrication procedures. FIGS. 21 and 22 were taken from "Three-dimensional GaN for semipolar light emitters," Physica Status Solidi (b) 248(3):549-560 (2011) by T. Wunderer et al.

Figure 23:
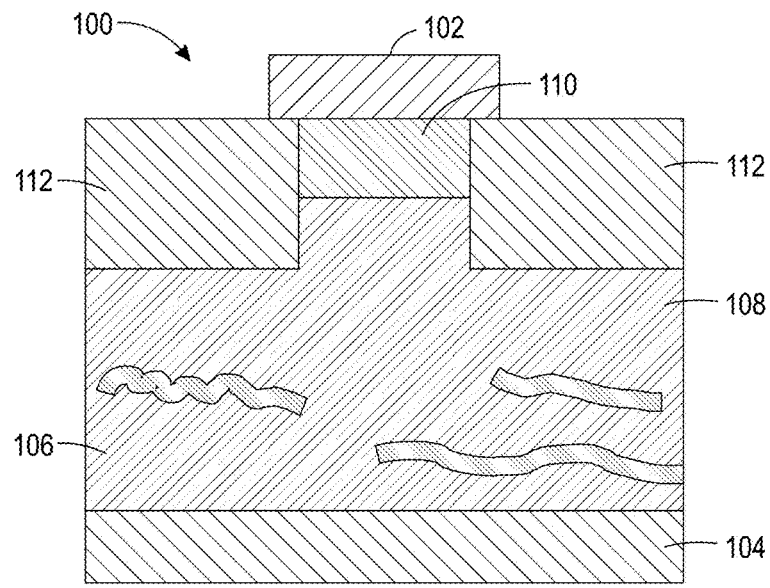
FIG. 23 illustrates a diode according to an example embodiment.
Figure 24:
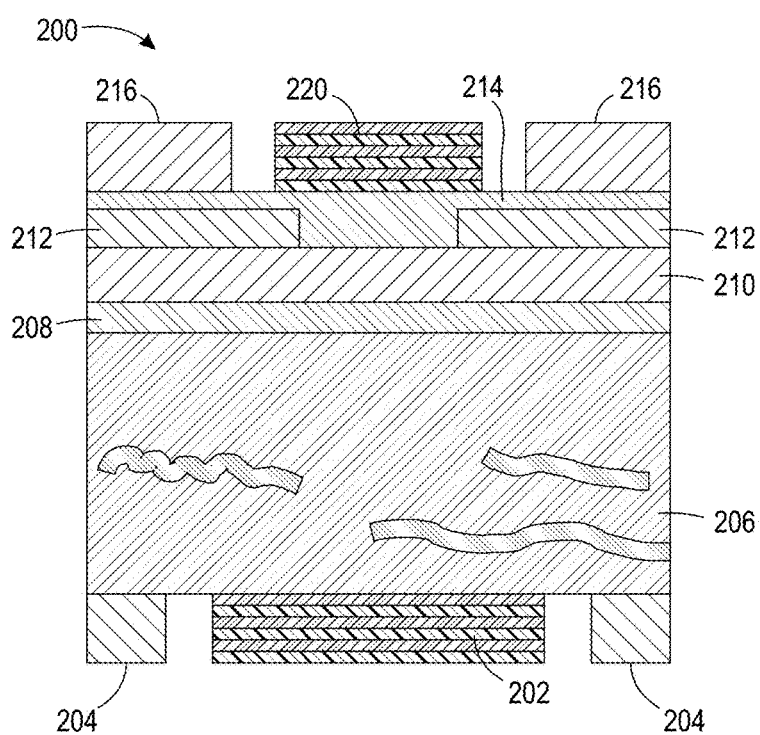
FIG. 24 illustrates a vertical cavity surface emitting laser (VCSEL) according to an example embodiment.

It should be noted that the example embodiments provided herein are specific to the fabrication of GaN-based devices and LED chiplets. Other materials, such as indium gallium nitride, aluminum gallium nitride, etc., other material systems, such as gallium arsenide, gallium indium phosphide, etc., and other devices, such as transistors, diodes, VCSELs, etc., may be used as well. An example of a diode fabricated according to various embodiments described herein is shown in FIG. 23. The diode 100 includes an anode 102, a cathode 104, an n-type GaN region 106, an n-type GaN drift region 108, a p-type GaN region 110, and isolation regions 112. An example of a VCSEL fabricated according to various embodiments described herein is shown in FIG. 24. The VCSEL 200 includes a first dielectric, distributed Bragg reflector 202, n-contact metal 204, an n-type GaN region 206, an active zone 208 (e.g., InGaN/GaN MQWs), a p-type GaN region 210, an electrical insulator 212 (e.g., SiO$_2$), a transparent conductor 214 (e.g., ITO), a p-contact metal 216 and a second dielectric, distributed Bragg reflector 220. Other device processing procedures, such as contact formation, passivation layers, etc., are device specific and may be incorporated into a fabrication process. Each of the noted variations may be used without departing from the spirit or scope of disclosure.

Systems, devices or methods disclosed herein may include one or more of the features structures, methods, or combination thereof described herein. For example, a device or method may be implemented to include one or more of the features and/or processes above. It is intended that such device or method need not include all of the features and/or processes described herein, but may be implemented to include selected features and/or processes that provide useful structures and/or functionality.

Various modifications and additions can be made to the disclosed embodiments discussed above. Accordingly, the scope of the present disclosure should not be limited by the particular embodiments described above, but should be defined only by the claims set forth below and equivalents thereof.

The invention claimed is:

1. A device comprising:
a first thin film layer atop a substrate;
a second thin film layer, grown from the first thin film through a patterned mask, having openings;
a heterostructure within the second thin film layer; and
at least one vertical trench having a depth that is at least substantially the thickness of the second thin film layer,
wherein the second thin film layer is configured to be released from the first thin film layer atop the substrate.

2. The device of claim 1, wherein the first thin film layer has a threading dislocation density of less than $10^9$ cm$^2$.

3. The device of claim 1, wherein the at least one vertical trench is configured substantially similarly to mask openings.

4. The device of claim 1, wherein the second thin film layer is a gallium-nitride based film.

5. The device of claim 1, the second thin film layer has a height substantially in the range of 2 μm to 20 μm.

6. The device of claim 1, wherein the released second thin film layer has an area substantially in the range of 25 μm$^2$ to 1 mm$^2$.

7. The device of claim 1, wherein the second thin film layer is configured to be incorporated into a printed electronic device, a flexible transparent display, a flexible large area luminaire display, a photovoltaic display, a micro-display, an integrated circuit, or light-emitting diode chiplets.

8. The device of claim 7, wherein the integrated circuit comprises one or more of a light-emitting diode, laser diode, vertical-cavity surface-emitting laser, transistor, or diode.

9. The device of claim 1, wherein the substrate is configured to be reusable after the second thin film layer is released from the first thin film.

10. A method for fabricating a thin-film device comprising:
growing a first film on a substrate;
depositing and patterning a mask atop the first film;
growing a second film about the mask;
growing a device heterostructure within the second film;
creating a trench which establishes a perforated interface within the second film; and
releasing the second film from the first film.

11. The method of claim 10, wherein the perforated interface provides access to the mask and the method further comprising applying a wet etchant to the perforated interface to release the second film from the underlying first film.

12. The method of claim 10, wherein the second film is a gallium-nitride based epitaxial film.

13. The method of claim 10, wherein the heterostructure comprises a heterostructure for a light-emitting diode, laser diode, vertical-cavity surface-emitting laser, transistor, or diode.

14. The method of claim 10, further comprising growing the second film by growing a three-dimensional film portion and a two-dimensional film portion to substantially planarize the three-dimensional portion.

15. A device comprising:
a GaN substrate;
a thin film layer, grown from the substrate through a patterned mask, having openings;
a heterostructure within the thin film layer; and
at least one vertical trench having a depth that is substantially the thickness of the thin film layer, wherein the thin film layer is configured to be released from the substrate.

16. The device of claim 15, wherein the substrate is configured to be reusable after the thin film layer is released from the substrate.

17. The device of claim 15, wherein the at least one vertical trench is configured substantially similarly to mask openings.

18. The device of claim 15, comprising a plurality of trenches providing a perforated interface to the patterned mask.

19. The device of claim 15, wherein the thin film layer is a gallium-nitride based film.

20. The device of claim 15, wherein the thin film layer is configured to be incorporated into a printed electronic device, a flexible transparent display, a flexible large area luminaire display, a photovoltaic display, a micro-display, an integrated circuit, or light-emitting diode chiplets.

* * * * *